(12) United States Patent
Hirano et al.

(10) Patent No.: US 11,152,543 B2
(45) Date of Patent: Oct. 19, 2021

(54) NITRIDE SEMICONDUCTOR LIGHT-EMITTING ELEMENT

(71) Applicant: Soko Kagaku Co., Ltd., Ishikawa (JP)

(72) Inventors: Akira Hirano, Aichi (JP); Yosuke Nagasawa, Nara (JP)

(73) Assignee: SOKO KAGAKU CO., LTD., Ishikawa (JP)

( * ) Notice: Subject to any disclaimer, the term of this patent is extended or adjusted under 35 U.S.C. 154(b) by 63 days.

(21) Appl. No.: 16/761,090

(22) PCT Filed: Nov. 22, 2017

(86) PCT No.: PCT/JP2017/042063
§ 371 (c)(1),
(2) Date: May 1, 2020

(87) PCT Pub. No.: WO2019/102557
PCT Pub. Date: May 31, 2019

(65) Prior Publication Data
US 2020/0357953 A1    Nov. 12, 2020

(51) Int. Cl.
*H01L 33/32* (2010.01)
*H01L 33/06* (2010.01)
(Continued)

(52) U.S. Cl.
CPC .......... *H01L 33/32* (2013.01); *H01L 33/0025* (2013.01); *H01L 33/06* (2013.01); *H01L 33/18* (2013.01); *H01L 33/20* (2013.01)

(58) Field of Classification Search
CPC ......... H01L 33/18; H01L 33/24; H01L 33/32; H01L 33/20; H01L 33/06
See application file for complete search history.

(56) References Cited

U.S. PATENT DOCUMENTS 6,657,234 B1   12/2003  Tanizawa
10,297,715 B2 *  5/2019  Kaneda ................. H01L 33/32
(Continued)

FOREIGN PATENT DOCUMENTS

CN      1353867 A    6/2002
JP   2002033513 A    1/2002
(Continued)

OTHER PUBLICATIONS

Michael Kneissl, "A Brief Review of III-Nitride UV Emitter Technologies and Their Applications", III-Nitride Ultraviolet Emitters, Chapter 1, at least as early as Dec. 2016.

*Primary Examiner* — Savitri Mulpuri
(74) *Attorney, Agent, or Firm* — Haynes Beffel & Wolfeld LLP (57) ABSTRACT

The nitride semiconductor light-emitting element comprises a light-emitting element structure portion having a plurality of nitride semiconductor layers including at least an n-type layer, an active layer and a p-type layer. The active layer has a quantum well structure comprising at least one well layer composed of a GaN-based semiconductor. In the well layer, the shortest distance between a first surface on the n-type layer side and a second surface on the p-type layer side varies in an orthogonal plane to the layering direction of the nitride semiconductor layers, and the peak emission wavelength of light emitted from the light-emitting element structure portion is shorter than 354 nm.

3 Claims, 8 Drawing Sheets

(51) Int. Cl.
*H01L 33/18* (2010.01)
*H01L 33/20* (2010.01)
*H01L 33/00* (2010.01)

(56) References Cited

U.S. PATENT DOCUMENTS

| | | | |
|---|---|---|---|
| 11,049,999 B2 * | 6/2021 | Hirano | H01L 21/02458 |
| 2014/0209857 A1 * | 7/2014 | Takano | H01L 33/007 |
| | | | 257/13 |
| 2016/0064598 A1 | 3/2016 | Choi et al. | |
| 2016/0322534 A1 | 11/2016 | Park et al. | |
| 2017/0309779 A1 | 10/2017 | Atanackovic | |
| 2018/0341055 A1 * | 11/2018 | Yuan | G02F 1/133512 |

FOREIGN PATENT DOCUMENTS

| | | |
|---|---|---|
| JP | 2003086840 A | 3/2003 |
| JP | 2006060164 A | 3/2006 |
| JP | 2012044120 A | 3/2012 |
| JP | 6194138 B2 | 9/2017 |
| TW | 201740578 A | 11/2017 |

* cited by examiner

NITRIDE SEMICONDUCTOR LIGHT-EMITTING ELEMENT

BACKGROUND ART

The present invention relates to a nitride semiconductor light-emitting element having a light-emitting layer composed of a GaN-based semiconductor.

Conventionally, a nitride semiconductor light-emitting element with a light-emitting layer composed of an InGaN-based semiconductor, in which light emission is occurred by recombination of the carrier (electrons and holes), is widely spread.

However, a nitride semiconductor light-emitting element with a light-emitting layer composed of a GaN-based semiconductor, and a nitride semiconductor light-emitting element with a light-emitting layer composed of an AlGaN-based semiconductor have a problem that the light emission efficiency is low, and it has become an obstacle to popularization. Incidentally, the light emission efficiency of the semiconductor light-emitting element is expressed as a quantum efficiency that is a ratio of converting injected electrons into photons. The ratio when focusing on photons generated inside a light-emitting element is referred to as an internal quantum efficiency whereas the ratio when focusing on photons discharged outside the light-emitting element is referred to as an external quantum efficiency.

Figure 8:
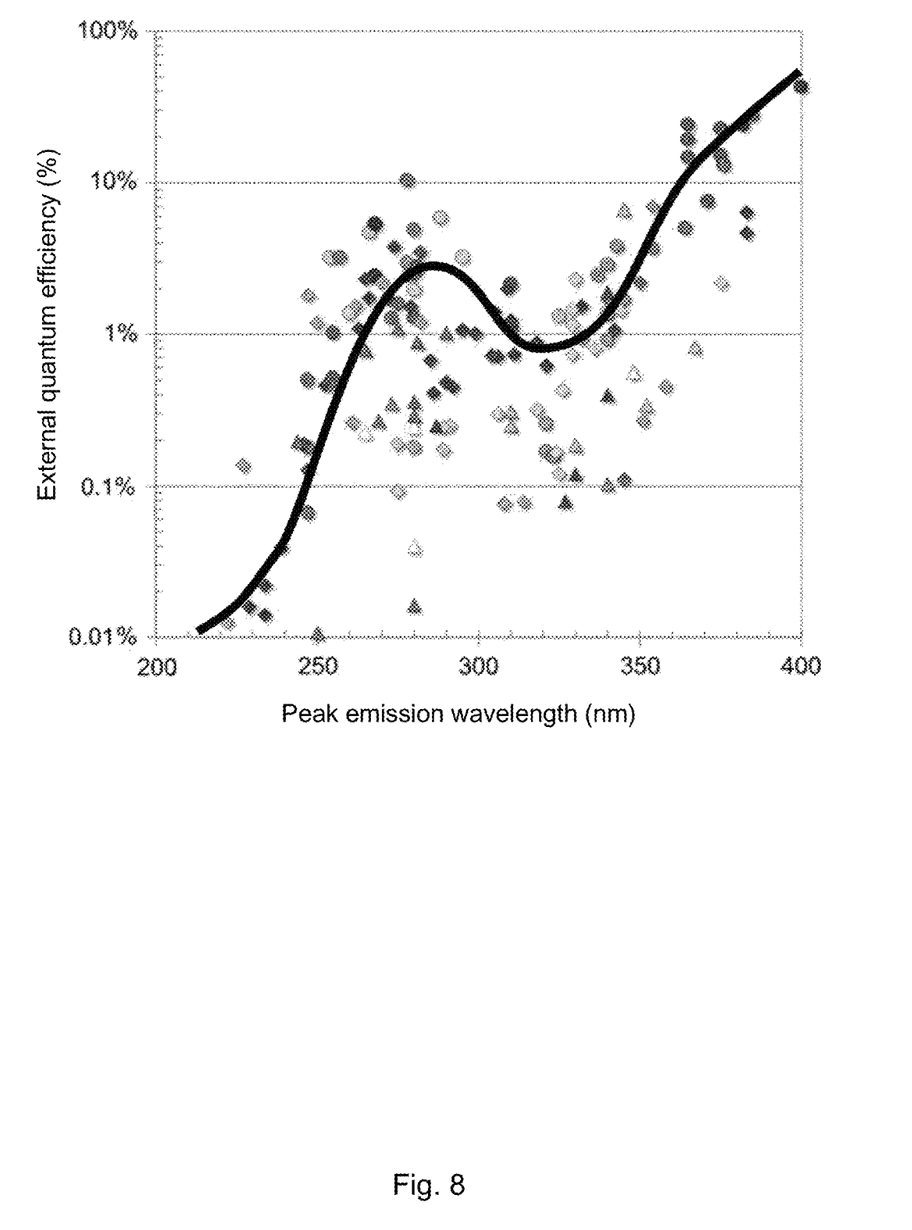
FIG. 8 is a graph showing the relationship between the peak emission wavelength and the external quantum efficiency of the nitride semiconductor light-emitting element.

The above problem will be described in detail. FIG. 8 is a graph showing the relationship between a peak emission wavelength and the external quantum efficiency of the nitride semiconductor light-emitting element. FIG. 8 is a graph described in Non-Patent Document 1, which is a collection of data reported by various companies and research institutes in academic papers and the like. Further, the horizontal axis of the graph of FIG. 8 represents the peak emission wavelength, whereas the vertical axis represents the external quantum efficiency. In FIG. 8, for convenience of explanation of the drawings, a curve that is not a precise approximate curve but represents the overall trend of points is added to the graph described in Non-Patent Document 1.

As shown in FIG. 8, for the nitride semiconductor light-emitting elements having a peak emission wavelength of 300 nm or more and 350 nm or less, the external quantum efficiency is locally low as compared with the peripheral peak emission wavelength. Further, for the nitride semiconductor light-emitting elements having a peak emission wavelength of 285 nm or less, the external quantum efficiency becomes steeply low as the peak emission wavelength is shortened. Generally, the nitride semiconductor light-emitting element having a peak emission wavelength of 300 nm or more and 350 nm or less is a nitride semiconductor light-emitting elements with a light-emitting layer composed of an AlGaN-based semiconductor or a GaN-based semiconductor, and the nitride semiconductor light-emitting element having a peak emission wavelength of 285 nm or less is a nitride semiconductor light-emitting elements with a light-emitting layer composed of an AlGaN-based semiconductor.

For the nitride semiconductor light-emitting element with the light-emitting layer composed of an AlGaN-based semiconductor, by intensive studies of the present inventors, it has been found that it is possible to improve the external quantum efficiency by increasing the emission intensity by utilizing the segregation of Ga (see Patent Document 1). In AlGaN of a group III-V semiconductor, Al and Ga are both allocated at the group III sites in the crystal structure. The segregation of Ga means that a region where the ratio of Ga is locally large (the ratio of Al is locally small) is formed in a plane perpendicular to the growth direction of the semiconductor layer.

PRIOR ART DOCUMENTS

Patent Document

PATENT DOCUMENT 1: Japanese Patent No. 6194138

Non Patent Document

Non Patent Document 1: Michael Kneissl, "A Brief Review of III-Nitride UV Emitter Technologies and Their Applications", III-Nitride Ultraviolet Emitters, Chapter 1, 2016

SUMMARY OF THE INVENTION

Problems to be Solved by the Invention

However, the nitride semiconductor light-emitting element with the light-emitting layer composed of a GaN-based semiconductor, unlike the nitride semiconductor light-emitting element with the light-emitting layer composed of an AlGaN-based semiconductor, the segregation cannot occur because only Ga is allocated at the group III sites, it is impossible to improve the external quantum efficiency by utilizing the same principles as Patent Document 1. This becomes a problem.

Therefore, the present invention provides a nitride semiconductor light-emitting element having a light-emitting layer composed of a GaN-based semiconductor in which the external quantum efficiency is improved.

Means for Solving the Problem

A nitride semiconductor light-emitting element comprising a light-emitting element structure portion having a plurality of nitride semiconductor layers including at least an n-type layer, an active layer and a p-type layer is to be provided, wherein the active layer disposed between the n-type layer and the p-type layer has a quantum well structure comprising at least one well layer composed of a GaN-based semiconductor, a shortest distance between a first surface of the well layer on the n-type layer side and a second surface of the well layer on the p-type layer side varies in an orthogonal plane to the layering direction of the nitride semiconductor layers, and a peak emission wavelength of light emitted from the light-emitting element structure portion is shorter than 354 nm.

According to this nitride semiconductor light-emitting element, it is possible to cause a portion capable of efficiently emitting light in an orthogonal plane to the layering direction of the nitride semiconductor layers, and to emit light in the portion of the well layer.

Incidentally, 354 nm is a peak emission wavelength when the well layer of the quantum well structure is composed of the GaN-based semiconductor and the thickness of the well layer in the orthogonal plane to the layering direction of the nitride semiconductor layers (the shortest distance) does not vary. If the peak emission wavelength is shorter than 354 nm (if shifted to the short wavelength side), it can be said that the variation of the quantum confinement effect due to fluctuating the thickness of the well layer in the orthogonal plane to the layering direction of the nitride semiconductor layers act effectively.

For example, in the nitride semiconductor light-emitting element having the above feature, an emission spectrum of light emitted from the light-emitting element structure portion may have a composite peak formed by integrating at least two of a first peak of 339 nm or more and less than 343 nm, a second peak of 343 nm or more and less than 349 nm, and a third peak of 349 nm or more and less than 353 nm.

In particular, in the nitride semiconductor light-emitting element having the above feature, the full width at half maximum of the composite peak may be 10 nm or less. In the nitride semiconductor light-emitting element of the above feature, the emission spectrum may have a composite peak formed by integrating the first peak and the second peak, and the peak emission wavelength may be greater than or equal to 343 nm and less than 349 nm.

According to these nitride semiconductor light-emitting elements, it is possible to improve the emission intensity of the peak emission wavelength.

In the nitride semiconductor light-emitting element having the above feature, an emission spectrum of light emitted from the light-emitting element structure portion may have at least two of a first peak of 339 nm or more and less than 343 nm, a second peak of 343 nm or more and less than 349 nm, and a third peak of 349 nm or more and less than 353 nm.

In the nitride semiconductor light-emitting element of the above feature, the nitride semiconductor light-emitting element may further include an underlying portion including a sapphire substrate, wherein the sapphire substrate has a main surface inclined by a predetermined angle with respect to a (0001) plane, the light-emitting element structure portion is formed above the main surface, and at least each layer from the main surface of the sapphire substrate to the surface of the active layer may be an epitaxially grown layer having a surface on which multi-step terraces are formed.

According to this nitride semiconductor light-emitting element, the thickness in the horizontal plane of the well layer can be easily fluctuated by using a sapphire substrate having an off-angle and performing epitaxial growth so that the multi-step terraces appear on the surface of each layer from the main surface of the sapphire substrate to the surface of the active layer. Furthermore, since the thickness of the well layer can be fluctuated in the orthogonal plane to the layering direction of the nitride semiconductor layers at a period of several nm to several tens of nm shorter than the carrier diffusion length, it is possible to reliably feed the carrier to the portion capable of efficiently emitting light in the well layer.

Effect of the Invention

According to the nitride semiconductor light-emitting element having the above features, in the well layer it is possible to cause a portion capable of efficiently emitting light in an orthogonal plane to the layering direction of the nitride semiconductor layers, and to improve the external quantum efficiency.

DESCRIPTION OF EMBODIMENT

Hereinafter, in explaining embodiments of the present invention, a nitride semiconductor light-emitting element is exemplified which is a light-emitting diode having an underlying portion including a sapphire substrate and a light-emitting element structure portion having a plurality of nitride semiconductor layers stacked on the underlying portion.

In the present application, the AlGaN-based semiconductor means AlGaN, AlN, or GaN. Alternatively, the AlGaN-based semiconductor means AlGaN, AlN, or GaN containing a trace amount of an impurity (e.g., Si, Mg, In, or the like). If necessary, subscripts are attached to Al and Ga to represent a relative composition ratio of Al and Ga (e.g., $Al_XGa_{1-X}N$). In the present application, the GaN-based semiconductor means GaN or GaN containing a trace amount of impurities (e.g., Si, Mg, In, etc.), and although Al is not contained in principle, the GaN-based semiconductor also includes the case where Al is contained in GaN at the impurity level. In the present application, a semiconductor layer in which neither p-type nor n-type is described means an undoped semiconductor layer, but even an undoped semiconductor layer may contain a trace amount of impurities that inevitably mixes.

<Nitride Semiconductor Light-Emitting Element>

Figure 1:
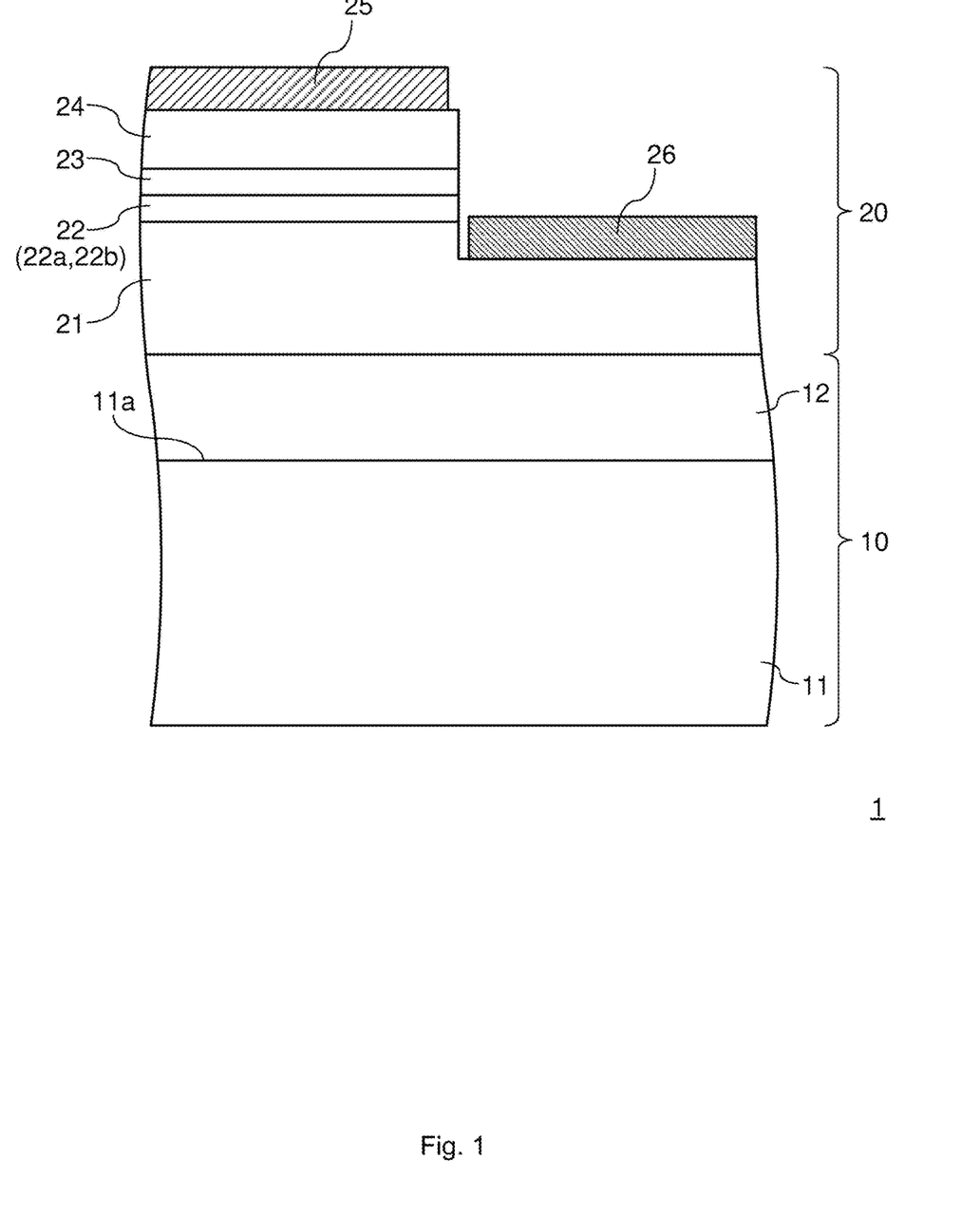
FIG. 1 is a fragmentary cross-sectional view schematically showing an exemplary configuration of a nitride semiconductor light-emitting element according to an embodiment of the present invention.
Figure 2:
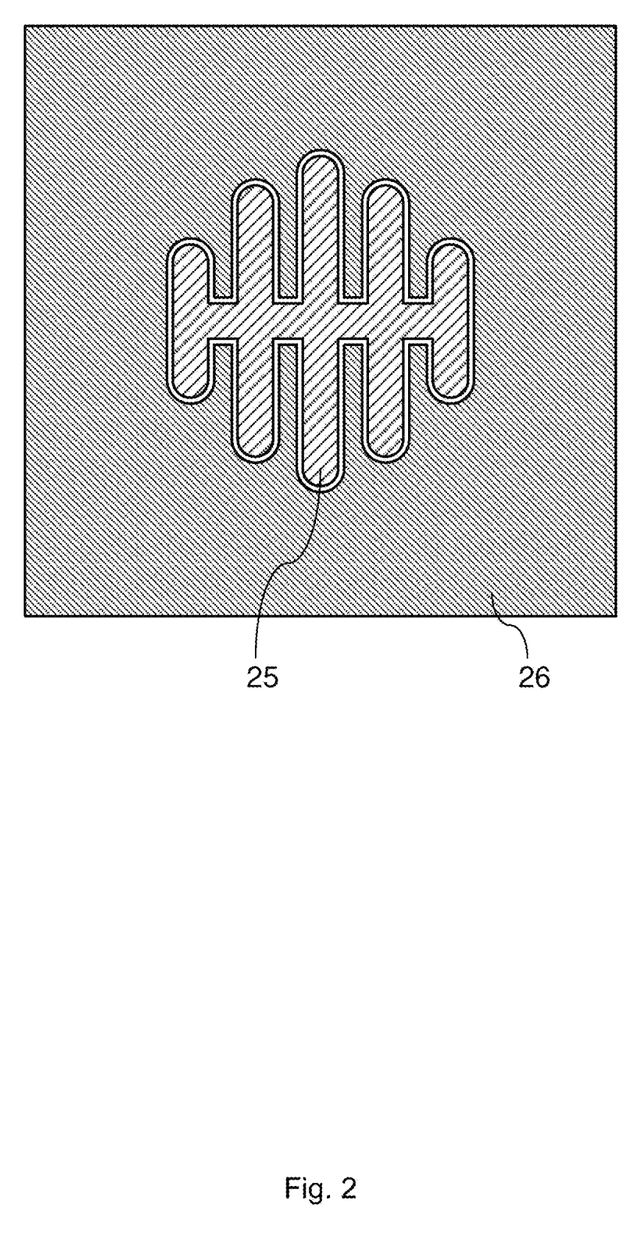
FIG. 2 is a plan view schematically showing an exemplary configuration of the nitride semiconductor light-emitting element shown in FIG. 1 as viewed from above in FIG. 1.

First, an example of a structure of a nitride semiconductor light-emitting element according to an embodiment of the present invention will be described with reference to the drawings. FIG. 1 is a fragmentary cross-sectional view schematically showing an exemplary configuration of a nitride semiconductor light-emitting element according to an embodiment of the present invention. FIG. 2 is a plan view schematically showing an exemplary configuration of the nitride semiconductor light-emitting element shown in FIG. 1 as viewed from above in FIG. 1. In FIG. 1, for the convenience of description of the drawings, since the thicknesses of the substrate, the nitride semiconductor layers and the electrodes (vertical length in the figure) are shown schematically, not necessarily coincide with the actual dimensional ratio.

As shown in FIGS. 1 and 2, the nitride semiconductor light-emitting element 1 according to the embodiment of the present invention comprises an underlying portion 10 including a sapphire substrate 11 and a light-emitting element structure portion 20 including a plurality of nitride semiconductor layers 21 to 24 and electrodes 25 and 26. The nitride semiconductor light-emitting element 1 is mounted (flip-chip mounted) on a mounting base with facing a side of the light-emitting element structure portion 20 (an upper side in FIG. 1) toward the mounting base, and light is extracted from a side of the underlying portion 10 (a lower side in FIG. 1).

The underlying portion 10 includes a sapphire substrate 11 having a main surface which is inclined by a predetermined angle (off-angle) with respect to the (0001) plane, and an AlN layer 12 formed directly on the main surface 11a of the sapphire substrate 11.

Figure 3:
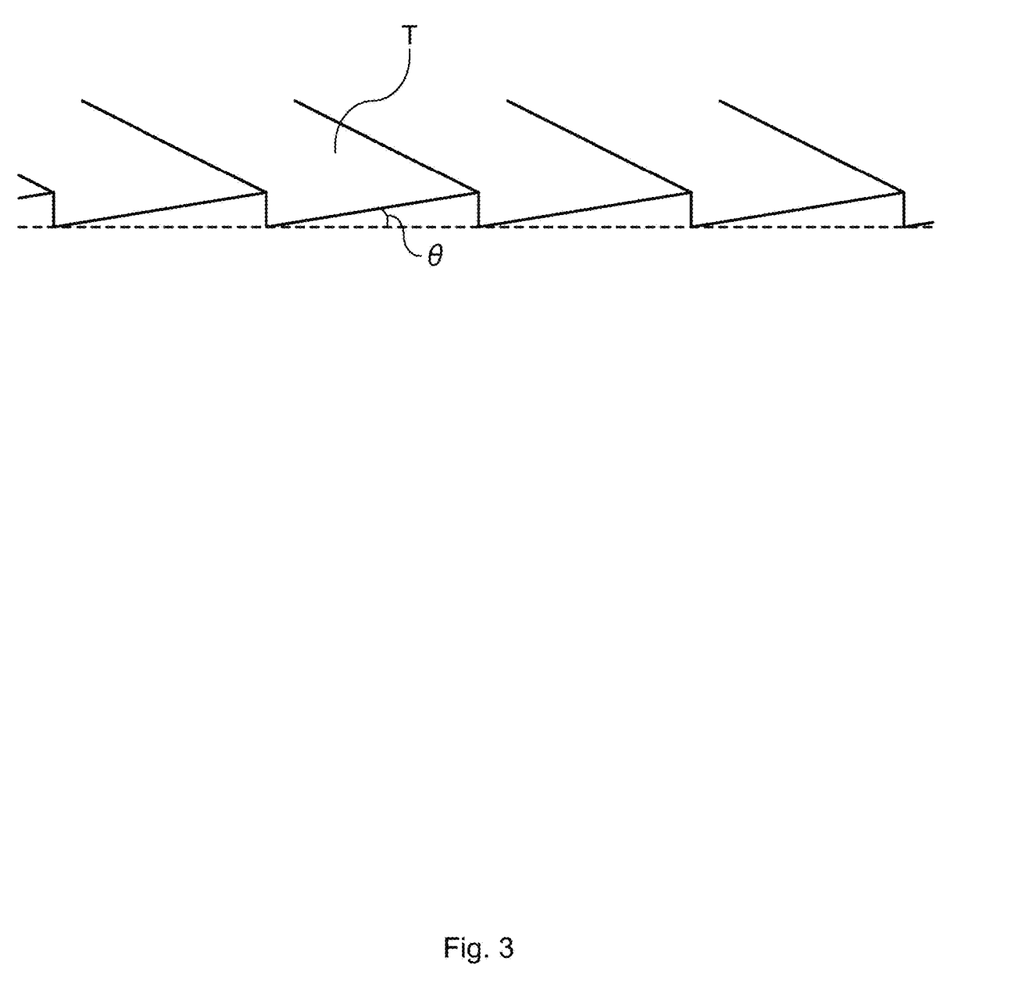
FIG. 3 is a perspective view schematically showing a state of the surface of the off-substrate enlarged to atomic level.

Here, the state of the main surface 11a of the sapphire substrate 11 will be described with reference to the drawings. FIG. 3 is a perspective view schematically showing a state of the main surface of the sapphire substrate enlarged to atomic level. In FIG. 3, since the substance of the invention is schematically shown while the principal part is emphasized for easy understanding of the descriptions, the dimensional ratio of each part is not necessarily identical to that of the actual element.

As shown in FIG. 3, the multi-step terraces T are formed on the main surface of the sapphire substrate 11. This is because when the bulk single crystal of sapphire is cut out at an angle (i.e., off angle θ) which is slightly inclined with respect to the (0001) plane, the (0001) planes appear along the cutting direction. Note that the magnitude of the off angle θ and the direction in which the off angle is set (specifically, the direction in which the (0001) plane is inclined, for example, the m-axis direction or the a-axis direction) may be arbitrarily determined as long as desired growth is realized in each layer on the sapphire substrate 11.

The AlN layer 12 is composed of AlN crystal epitaxially grown from the main surface of the sapphire substrate 11, the AlN crystal has an epitaxial crystal orientation relationship with respect to the main surface 11a of the sapphire substrate 11. Specifically, for example, the AlN crystal is grown, as the C-axis direction of the sapphire substrate 11 (<0001> direction) and the C-axis direction of the AlN crystal is aligned. The AlN crystals constituting the AlN layer 12 may contain a trace amount of Ga or another impurity. Further, on an upper surface of the AlN layer 12, layers composed of $Al_\alpha Ga_{1-\alpha}N$ ($1>\alpha>0$) based semiconductor may be further formed.

The light-emitting element structure portion 20 has a configuration in which an n-type clad layer 21 (n-type layer), an active layer 22, an electron blocking layer 23 (p-type layer) and a p-type contact layer (p-type layer) 24 are stacked in order from a side of the underlying portion 10 by epitaxially growing them in order.

The n-type clad layer 21 is composed of an n-type $Al_X Ga_{1-X}N$ ($1 \geq X > 0$) based semiconductor. The active layer 22 has a single or multiple quantum well structure in which one or more layers of a well layer 22b (light-emitting layer) composed of the GaN-based semiconductor and a barrier layer 22a composed of an $Al_Y Ga_Y N$ ($X \geq Y > 0$) based semiconductor are alternately stacked. The electron blocking layer 23 is composed of a p-type $Al_Z Ga_{1-Z}N$ ($1 \geq Z > Y$) based semiconductor. The p-type contact layer 24 is composed of a p-type $Al_Q Ga_{1-Q}N$ ($Z > Q \geq 0$) semiconductor.

Furthermore, the light-emitting element structure portion 20 includes a p-electrode 25 that is composed of, for example, Ni/Au, and formed on an upper surface of the p-type contact layer 24, and an n-electrode 26 that is composed of, for example, Ti/Al/Ti/Au and formed on an upper surface of the n-type clad layer 21 in a partial region where the n-type cladding layer 21 is exposed. When electrical current is applied so that holes are supplied from the p-electrode 25 and electrons are supplied from the n-electrode 26, each of the supplied holes and electrons reaches the active layer 22 and recombines to emit light.

Next, an example of a manufacturing method of the nitride semiconductor ultraviolet light-emitting device 1 illustrated in FIG. 1 will be described.

First, the AlN layer 11 included in the underlying portion 10 and the nitride semiconductor layers 21 to 24 included in the light-emitting element structure portion 20 are epitaxially grown and stacked in order on sapphire substrate 11 by a well-known epitaxial growth method such as an organometallic compound vapor phase epitaxy (MOVPE) method or a molecular beam epitaxy (MBE) method. At this time, Si, for example, is doped as a donor impurity in the n-type layer, and Mg, for example, is doped as an acceptor impurity in the p-type layer.

However, at least each layer from the main surface 11a of the sapphire substrate 11 to the surface of the active layer 22 (the AlN layer 11 and the nitride semiconductor layers 21 and 22) is epitaxially grown so that the multi-step terraces originating from the main surface 11a of the sapphire substrate 11 appear (so that the surface does not become flat as the terrace is filled). For example, the epitaxial growth is performed so that steps are formed on the surface of AlN layer 11 and the nitride semiconductor layers 21 and 22, and the average value of the height of the steps is 1 nm or more and 20 nm or less. For example, the epitaxial growth is performed so that the arithmetic mean roughness Ra on the surface of the active layer 22 becomes greater than or equal to 3 nm and less than or equal to 10 nm.

As a condition for such epitaxial growth, for example, an off-angle of the sapphire substrate 11 that is large within a certain range (e.g., from 0° to a few degrees), a growth rate by which terraces easily appear (e.g., by appropriately setting various conditions such as a growth temperature, a supply amount and flow rate of the source gas and the carrier gas to achieve the growth rate) and the like can be mentioned. Note that these conditions may differ depending on the type and structure of the film forming apparatus. Therefore, some samples are actually produced in the film forming apparatus, and these conditions may be specified.

Then, a partial region of the semiconductor layers stacked as described above is selectively etched by a well-known etching method such as reactive ion etching to expose the n-type clad layer 21 in the region. Then, by using a well-known film forming method such as an electron-beam evaporation method, the n-electrode 26 is formed on the n-type clad layer 21 in the etched region and the p-electrode 25 is formed on the p-type contact layer 24 outside the etched region. After one or both of the p-electrode 25 and the n-electrode 26 are formed, heat treatment may be performed by a well-known heat treatment method such as RTA (instantaneous thermal annealing).

The nitride semiconductor light-emitting element 1 can be used after being flip-chip mounted on a submount and sealed with a predetermined resin such as a silicone resin or amorphous fluororesin (for example, a lens shaped resin).

<Structure of Active Layer and Emission Spectrum>

Figure 4:
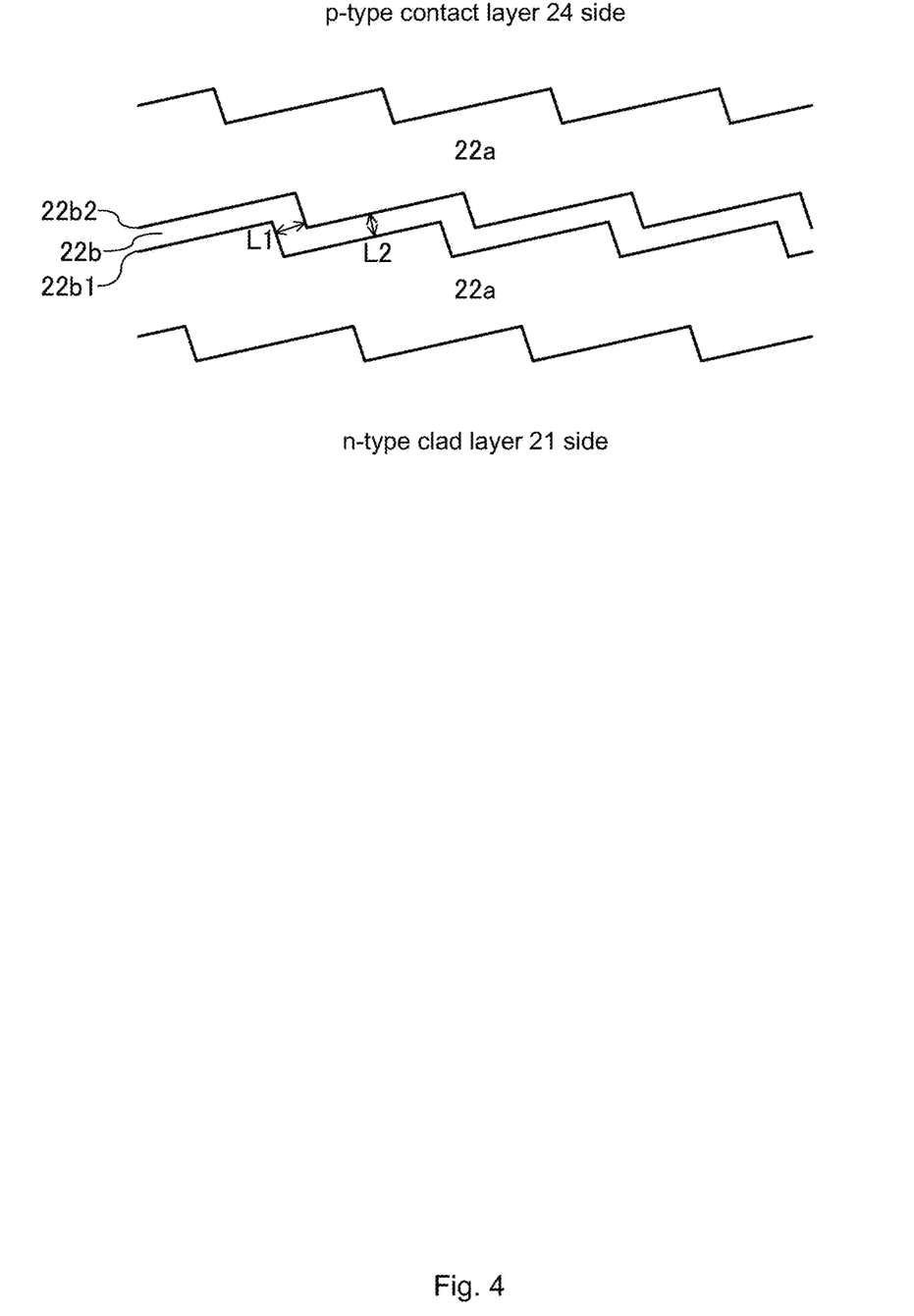
FIG. 4 is a fragmentary cross-sectional view schematically showing an exemplary structure of the active layer.

Next, the above-described active layer 22 will be described referring to the drawings. FIG. 4 is a fragmentary cross-sectional view schematically showing an exemplary structure of the active layer.

As shown in FIG. 4, in the active layer of the nitride semiconductor light-emitting element 1 according to the embodiment of the present disclosure, the surfaces of barrier layers 22a and the well layers 22b are formed in multiple steps. Furthermore, as described above, when at least the AlN layer 11 and the nitride semiconductor layers 21 and 22 are epitaxially grown so that the multi-step terraces originating from the main surface 11a of the sapphire substrate 11 appear, the sides of the terraces are preferentially grown. Then, in the well layer 22b, the shortest distance between the first surface 22b1 on the n-type clad layer 21 side and the second surface 22b2 on the p-type contact layer 24 side that is opposite to the n-type clad layer 21 side fluctuates in an orthogonal plane to the layering direction of the nitride semiconductor layers 21 and 22 (hereinafter, referred to as "in a horizontal plane"). In other words, the thickness of the well layer 22b varies in the horizontal plane. Specifically, the shortest distance (thickness) L1 in the side portion of the terrace is greater than the shortest distance (thickness) L2 in the terrace portion.

In the case of the well layer 22b of the structure as shown in FIG. 4, the quantum confinement effect may vary depending on the variation of the thickness in the horizontal plane. Therefore, in the well layer 22b, a portion capable of efficiently emitting light can be generated in the horizontal plane to emit light in the portion, and the external quantum efficiency can be improved. For example, in the nitride semiconductor light-emitting element 1 according to the embodiment of the present invention, it is possible to improve the external quantum efficiency to 3% or more in a state before resin sealing.

Figure 5:
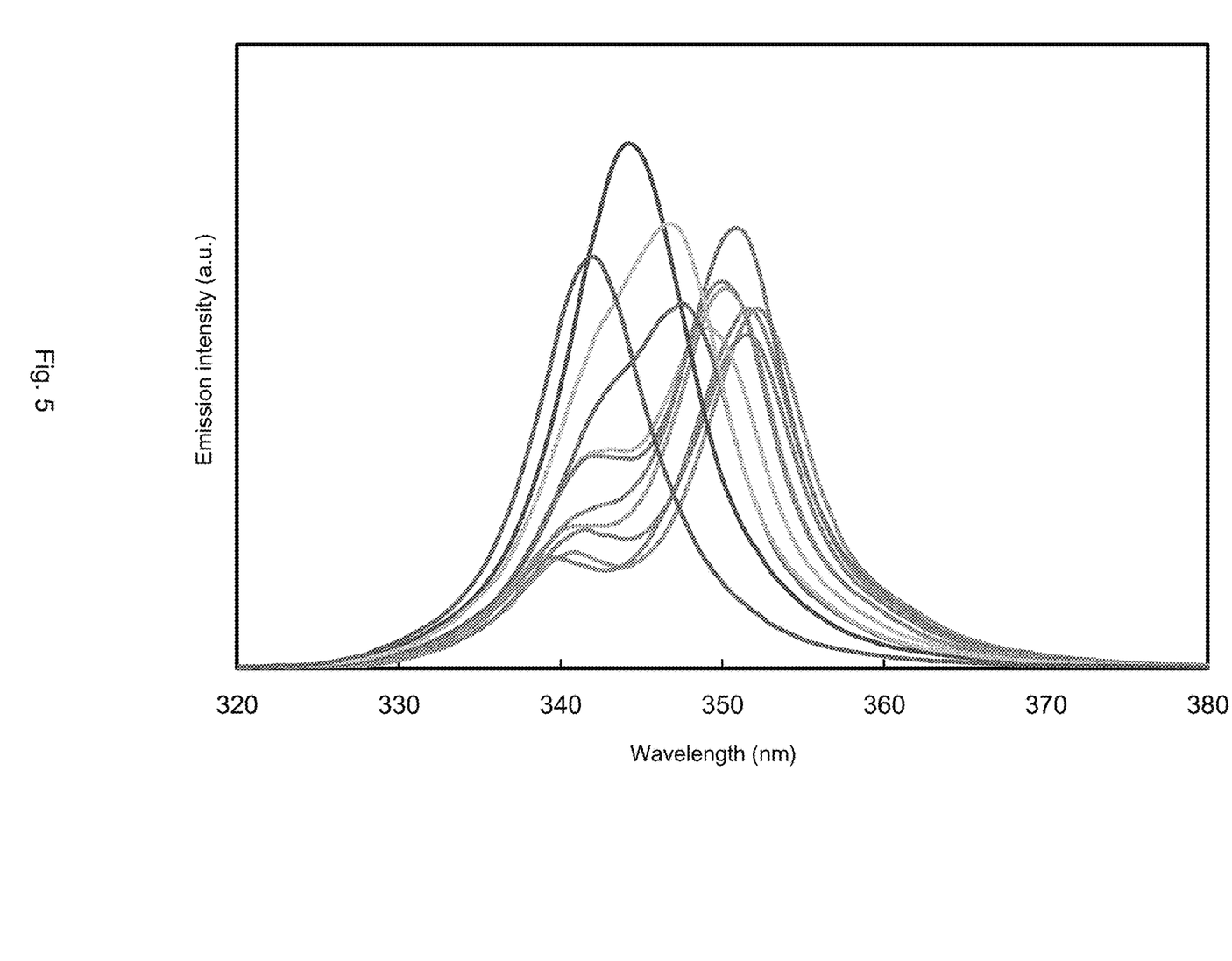
FIG. 5 is a spectral diagram showing an emission spectrum of the nitride semiconductor light-emitting element having the active layer shown in FIG. 4.
Figure 6:
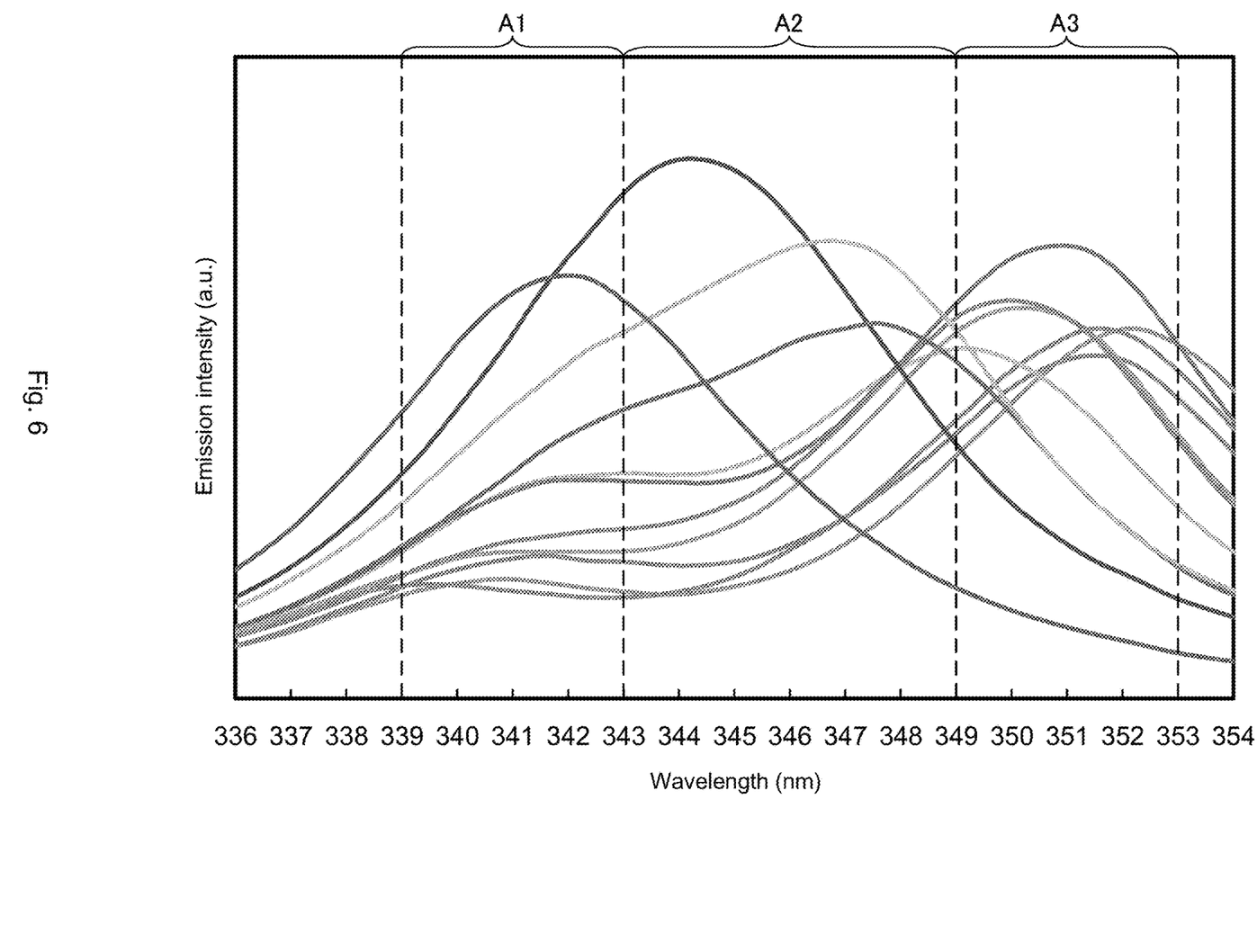
FIG. 6 is a spectral diagram enlarging a vicinity of a wavelength at which an emission intensity is large in FIG. 5.
Figure 7:
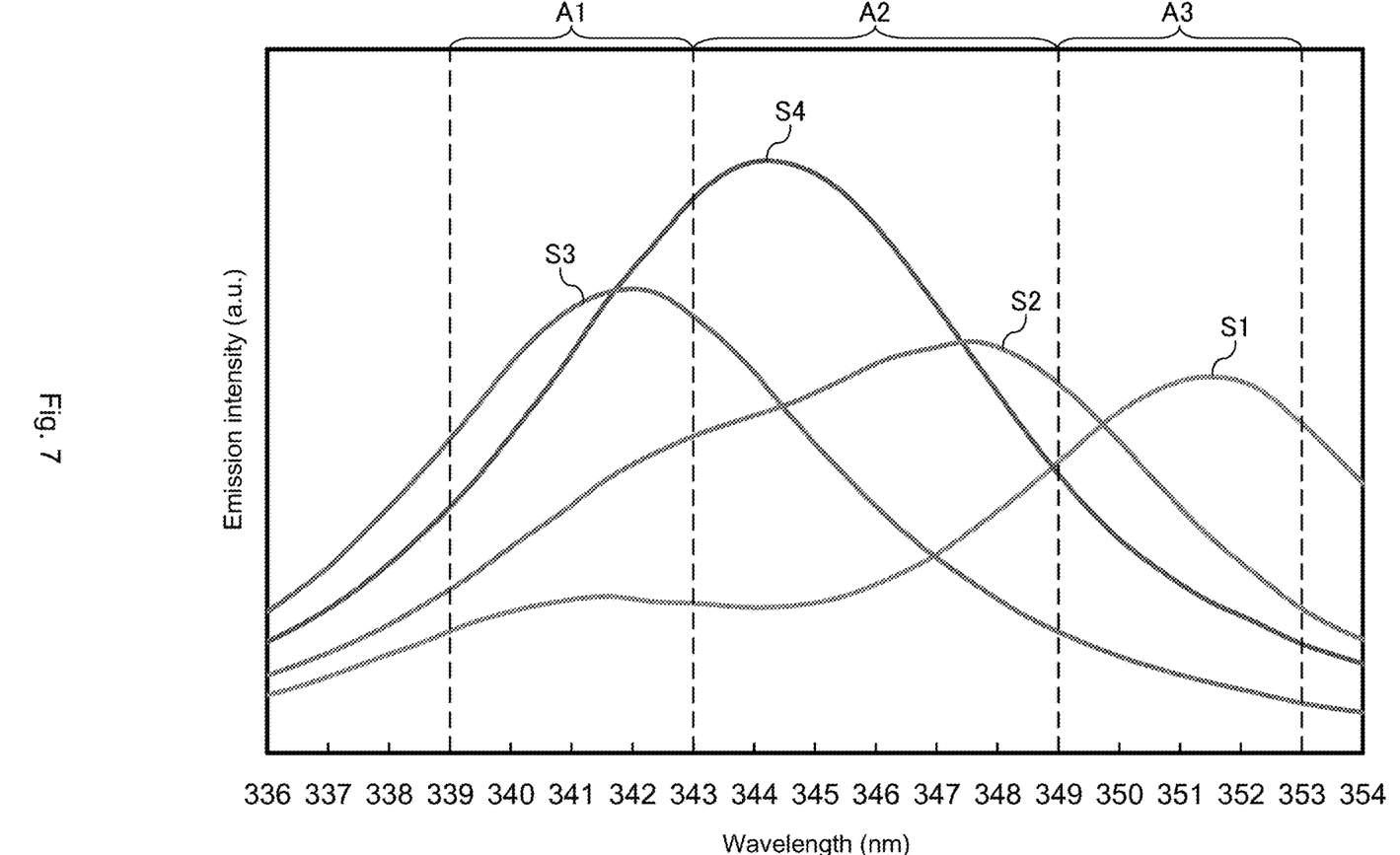
FIG. 7 is a spectral diagram selectively showing a main emission spectrum in FIG. 6.

The emission spectrum of the nitride-semiconductor light-emitting element having the active layer shown in FIG. 4 will be described referring to the drawings. FIG. 5 is a spectral diagram showing the emission spectrum of the nitride semiconductor light-emitting element having the active layer shown in FIG. 4. Further, FIG. 6 is a spectral diagram enlarging a vicinity of a wavelength at which an emission intensity is large in FIG. 5. FIG. 7 is a spectral diagram selectively showing a main emission spectrum in FIG. 6. The spectral diagrams shown in FIGS. 5 to 7 draw the emission spectra of a plurality of nitride semiconductor light-emitting elements obtained from one wafer, in which each of the emission spectra are superimposed to each other, and one line represents the emission spectrum of one nitride semiconductor light-emitting element. Further, the emission spectra shown in FIGS. 5 to 7 are the emission spectra of the nitride semiconductor light-emitting element 1 which is a state before resin sealing.

As shown in FIGS. 5-7, the emission spectrum of the nitride semiconductor light-emitting element having the active layer shown in FIG. 4 includes a plurality of peaks corresponding to the magnitude of the quantum confinement effects. These peaks may coexist distantly or may be integrated to form a composite peak. The composite peak is a peak that appears to be one peak, and for example, is a peak that does not have a definite local maximum value other than a wavelength at which the emission intensity becomes maximum, i.e., the peak emission wavelength.

The emission spectra shown in FIGS. 5 to 7 can be roughly classified into a pattern having a plurality of separated peaks (e.g., emission spectrum S1 in FIG. 7) and a pattern having a single composite peak (e.g., emission spectra S2 to S4 in FIG. 7). Many of the patterns having a plurality of separated peaks include peaks in the vicinity of 350 nm to 352 nm and peaks in the vicinity of 340 nm to 342 nm. Patterns having a single composite peak include those having a maximum peak in the vicinity of 340 nm to 342 nm and a shoulder having a remnant peak in the vicinity of 344 nm (e.g., emission spectrum S3 in FIG. 7), and those having a maximum peak in the vicinity of 344 nm to 348 nm and the remnant peak in the vicinity of 342 nm (e.g., emission spectra S2 and S4 in FIG. 7).

Therefore, the peaks included in the emission spectra shown in FIGS. 5 to 7 can be generally classified into a first peak included in the first wavelength range A1 of 339 nm or more and less than 343 nm, a second peak included in the second wavelength range A2 of 343 nm or more and less than 349 nm, and a third peak included in the third wavelength range A3 of 349 nm or more and less than 353 nm.

Since the emission wavelength of the emission spectrum of the pattern having a plurality of separated peaks varies, the maximum value of the emission intensity tends to be smaller than that of the emission spectrum having a composite peak. Therefore, in the nitride semiconductor light-emitting element 1 to improve the external quantum efficiency by fluctuating the thickness of the well layer 22b in the horizontal plane, it is possible to improve the emission intensity of the peak emission wavelength by configuring the nitride semiconductor light-emitting element 1 so that the emission spectrum of the emitted light has a composite peak. However, even if the nitride semiconductor light-emitting element 1 for emitting light of the emission spectrum having a plurality of separated peaks, since it is possible itself to efficiently emit light, it is possible to use such nitride semiconductor light-emitting element 1 depending on the application.

In addition, in the emission spectrum having the composite peak, the intensity of light emission can be improved by increasing the integrity of a plurality of peaks forming the composite peak. In particular, by increasing the integrity of the plurality of peaks until the full width at half maximum (FWHM: Full Width at Half Maximum) of the composite peak becomes 10 nm or less, the emission intensities of the peak emission wavelengths can be improved.

For example, the emission spectra S2 and S4 shown in FIG. 7 both have a composite peak formed by integrating the first peak and the second peak. In the emission spectrum S2, the shoulder derived from the first peak is large, and the full width at half maximum is 11.8 nm. The emission spectrum S4 has a shoulder smaller than that of the emission spectrum S2, and has a full width at half maximum of 9.1 nm. The composite peak of the emission spectrum S4 has a full width at half maximum of 10 nm or less, and has high integrity and high emission intensity of the peak emission wavelength as compared with the composite peak of the emission spectrum S2.

In addition, in the emission spectrum having the composite peak, the emission intensity of the peak emission wavelength can be improved by having the composite peak formed by integrating the first peak and the second peak, and by making the peak emission wavelength included in the second wavelength range A2 (343 nm or more and less than 349 nm).

For example, the emission spectra S3 and S4 shown in FIG. 7 both have a composite peak formed by integrating the first peak and the second peak, but the peak emission wavelength of the emission spectrum S3 is included in the first wavelength range A1 (339 nm or more and less than 343 nm), and the peak emission wavelength of the emission spectrum S4 is included in the second wavelength range A2 (343 nm or more and less than 349 nm). The composite peak of the emission spectrum S4 has a larger emission intensity of the peak emission wavelength than the composite peak of the emission spectrum S2.

Incidentally, whether the emission spectrum of the light emitted by the nitride semiconductor light-emitting element 1 has the composite peak is determined by the manner of variation of the quantum confinement effect. Namely, it is determined by the surface condition of the active layer 22 (the number of steps, density of steps, height of steps, and the like). Therefore, by controlling the surface condition of the active layer 22 by appropriately setting the conditions of epitaxial growth in the film forming apparatus to be used, it is possible to selectively produce the nitride semiconductor light-emitting element 1 in which the emission spectrum of the emitted light has the composite peak. Further, the nitride semiconductor light-emitting element 1 in which the emission spectrum of the emitted light has the composite peak can be obtained as much as possible from one wafer.

Incidentally, as in the nitride semiconductor light-emitting element proposed in Patent Document 1, when causing the segregation of Ga in the light-emitting layer composed of the AlGaN-based semiconductor, the peak emission wavelength shifts to the longer wavelength side as the degree of segregation of Ga increases. In contrast, the nitride semiconductor light-emitting element 1 according to the embodiment of the present invention, since the well layer 22b is composed of the GaN-based semiconductor, the segregation of Ga cannot occur. Furthermore, when the well layer of the quantum well structure is composed of the GaN-based semiconductor and the thickness of the well layer does not vary in the horizontal plane, the peak emission wavelength becomes about 354 nm (see FIG. 17 of Patent Document 1), the peak emission wavelength of the nitride semiconductor light-emitting element 1 according to the embodiment of the present invention as shown in FIGS. 5 to 7 is shorter than 354 nm, it is shifted to the shorter wavelength side.

Thus, the principle of the improvement of the external quantum efficiency in the nitride semiconductor light-emitting element 1 according to the embodiment of the present invention (variation of the quantum confinement effect in the horizontal plane) is clearly different from the principle (segregation of Ga) in the nitride semiconductor light-emitting element as proposed in Patent Document 1. Then, if the well layer 22b is composed of the GaN-based semiconductor and the peak emission wavelength is shorter than 354 nm (it is shifted to the shorter wavelength side), it can be said that the variation of the quantum confinement effect due to fluctuating the thickness of the well layer 22b in the horizontal plane act effectively.

<Modifications, etc.>

In the embodiment described above, the case where the thickness of the well layer 22b in the horizontal plane is fluctuated by using the multi-step terraces originating from the main surface 11a of the sapphire substrate 11 has been exemplified, but the thickness of the well layer 22b in the horizontal plane may be fluctuated by other methods.

For example, the thickness in the horizontal plane of the well layer can be fluctuated by forming concavities and convexities on either the main surface of the sapphire substrate or the surface of any layer between the main surface of the sapphire substrate and the layer just before the active layer. As a method of forming the concavities and convexities, for example, masks such as $SiO_2$ may be formed by patterning by nanoimprinting, fringe exposure, electron-beam exposure, steppers, or the like, or etching may be performed by a well-known etching method such as reactive ion etching.

On the other hand, as in the above-described embodiment, by the method of utilizing the multi-step terraces originating from the main surface 11a of the sapphire substrate 11, it is possible to easily fluctuate the thickness of the well layer 22b in the horizontal plane with only using the sapphire substrate 11 having an off-angle and performing epitaxial growth so that the multi-step terraces appear on the surface of the AlN layer 11 and the nitride semiconductor layers 21 and 22. In addition, since the thickness of the well layer 22b in the horizontal plane can be fluctuated in an interval of several nm to several tens of nm which is equal to or shorter than the carrier diffusion length, carriers can be reliably fed to a portion capable of efficiently emitting light in the well layer 22b.

Although the above-described embodiment illustrates the nitride semiconductor light-emitting element 1 comprising an underlying portion 10 comprising the sapphire substrate 11, the sapphire substrate 11 (and further some or all of the layers contained in the underlying portion 10) may be lifted off.

In the above-described embodiment, the nitride semiconductor light-emitting element 1 is exemplified as a non-resin sealed state (bare chip), and the emission spectra in that state are shown (FIGS. 5 to 7). However, a state in which the element 1 is sealed with a resin which does not significantly affect the shape of the emission spectrum (e.g., not disappearing the peak or creating a new peak) can also be included in the nitride semiconductor light-emitting element of the present invention.

INDUSTRIAL APPLICABILITY

The present invention can be applied to a nitride semiconductor light-emitting element having a light-emitting layer composed of the GaN-based semiconductor.

DESCRIPTION OF SYMBOLS

1: Nitride semiconductor light-emitting element
10: Underlying portion
11: Sapphire substrate
11a: Main surface
12: AlN layer
20: Light-emitting element structure portion
21: n-type cladding layer (n-type layer)
22: Active layer
22a: Barrier layer
22b: Well layer
22b1: First surface
22b2: Second surface
23: Electron blocking layer (p-type layer)
24: p-type contact layer (p-type layer)
25: p-electrode
26: n-electrode
A1~A3: First through third wavelength range
S1~S4: Emission spectrum
T: Terrace

The invention claimed is:

1. A nitride semiconductor light-emitting element comprising a light-emitting element structure portion having a plurality of nitride semiconductor layers including at least an n-type layer, an active layer and a p-type layer, wherein
the active layer disposed between the n-type layer and the p-type layer has a quantum well structure comprising at least one well layer composed of a GaN-based semiconductor,
in the well layer, a shortest distance between a first surface on the n-type layer side and a second surface on the p-type layer side varies in an orthogonal plane to the layering direction of the nitride semiconductor layers,
a peak emission wavelength of light emitted from the light-emitting element structure portion is shorter than 354 nm, and
an emission spectrum of light emitted from the light-emitting element structure portion has a composite peak formed by integrating at least two of a first peak of 339 nm or more and less than 343 nm, a second peak of 343 nm or more and less than 349 nm, and a third peak of 349 nm or more and less than 353 nm; and further including an underlying portion including a sapphire substrate, wherein the sapphire substrate has a main surface inclined by a predetermined angle with respect to a (0001) plane, the light-emitting element structure portion is formed above the main surface, and at least each layer from the main surface of the sapphire substrate to the surface of the active layer is an epitaxially grown layer having a surface on which multi-step terraces are formed.

2. The nitride semiconductor light-emitting element according to claim 1, wherein a full width at half maximum of the composite peak is 10 nm or less.

3. The nitride semiconductor light-emitting element according to 1, wherein the emission spectrum has a composite peak formed by integrating the first peak and the second peak, and the peak emission wavelength is greater than or equal to 343 nm and less than 349 nm.

* * * * *